United States Patent
Baiocco et al.

(10) Patent No.: US 8,704,332 B2
(45) Date of Patent: Apr. 22, 2014

(54) METAL OXIDE SEMICONDUCTOR FIELD EFFECT TRANSISTOR (MOSFET) GATE TERMINATION

(75) Inventors: Christopher V. Baiocco, Newburgh, NY (US); Daniel J. Jaeger, Wappingers Falls, NY (US); Carl J. Radens, LaGrangeville, NY (US); Helen Wang, LaGrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 9 days.

(21) Appl. No.: 13/495,081

(22) Filed: Jun. 13, 2012

(65) Prior Publication Data

US 2013/0334618 A1    Dec. 19, 2013

(51) Int. Cl.
H01L 29/786    (2006.01)
H01L 29/78     (2006.01)
H01L 29/06     (2006.01)

(52) U.S. Cl.
CPC ............... H01L 29/7816 (2013.01); H01L 29/0642 (2013.01)
USPC ............ 257/510; 257/327; 257/E29.054; 257/E29.261; 438/294; 438/427

(58) Field of Classification Search
CPC ............ H01L 29/0649; H01L 29/7816
USPC ......... 257/327, 411, 506, 510, E29.054, 257/E29.261; 438/287, 294, 427, 591
See application file for complete search history.

(56) References Cited

U.S. PATENT DOCUMENTS

| | | | |
|---|---|---|---|
| 6,197,702 B1 | 3/2001 | Tanabe et al. | |
| 6,642,581 B2 | 11/2003 | Matsuda et al. | |
| 6,646,313 B2* | 11/2003 | Shukuri et al. | 257/392 |
| 7,033,909 B2 | 4/2006 | Kim et al. | |
| 7,119,406 B2* | 10/2006 | Shukuri et al. | 257/392 |
| 7,488,656 B2 | 2/2009 | Cartier et al. | |
| 7,816,760 B2* | 10/2010 | Luo et al. | 257/510 |
| 7,838,945 B2* | 11/2010 | Saitoh et al. | 257/369 |
| 7,932,136 B2 | 4/2011 | Hua et al. | |
| 7,932,150 B2 | 4/2011 | Watanabe et al. | |
| 2002/0014641 A1* | 2/2002 | Shukuri et al. | 257/275 |
| 2007/0166890 A1 | 7/2007 | Cheng et al. | |
| 2008/0064220 A1* | 3/2008 | Fernandez et al. | 438/706 |

(Continued)

OTHER PUBLICATIONS

Notice of Allowance dated Sep. 6, 2013 from related U.S. Appl. No. 13/773,881.

*Primary Examiner* — Allan R Wilson
(74) *Attorney, Agent, or Firm* — Scully, Scott, Murphy & Presser, P.C.; H. Daniel Schnurmann

(57) ABSTRACT

A method of forming a semiconductor device is provided that includes forming an oxide containing isolation region in a semiconductor substrate to define an active semiconductor region. A blanket gate stack including a high-k gate dielectric layer may then be formed on the active semiconductor region. At least a portion of the blanket gate stack extends from the active semiconductor device region to the isolation region. The blanket gate stack may then be etched to provide an opening over the isolation region. The surface of the isolation region that is exposed by the opening may then be isotropically etched to form an undercut region in the isolation region that extend under the high-k gate dielectric layer. An encapsulating dielectric material may then be formed in the opening filling the undercut region. The blanket gate stack may then be patterned to form a gate structure.

10 Claims, 5 Drawing Sheets

(56) References Cited

U.S. PATENT DOCUMENTS

2008/0246112 A1* 10/2008 Luo et al. .................. 257/510
2009/0096032 A1* 4/2009 Saitoh et al. ............... 257/369
2009/0243031 A1 10/2009 Natzle et al.
2012/0235242 A1* 9/2012 Blatchford et al. .......... 257/368
2012/0248537 A1* 10/2012 Cai et al. .................... 257/368

* cited by examiner

US 8,704,332 B2

METAL OXIDE SEMICONDUCTOR FIELD EFFECT TRANSISTOR (MOSFET) GATE TERMINATION

BACKGROUND

The present disclosure relates to semiconductor devices including gate structures.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

In one embodiment, a method of forming a semiconductor device is provided that includes forming an oxide containing isolation region in a semiconductor substrate to define an active semiconductor region. A blanket gate stack including a high-k gate dielectric layer may then be formed on the active semiconductor region, wherein at least a portion of the blanket gate stack extends from the active semiconductor device region to the oxide containing isolation region. The blanket gate stack may then be etched to provide an opening over the oxide containing isolation region, wherein a base of the opening is provided by a surface of the oxide containing isolation region. The surface of the oxide containing isolation region that is exposed by the opening may then be isotropically etched to remove a portion of the oxide containing isolation region that is in contact with the high-k gate dielectric layer to form an undercut region at an interface between the blanket gate stack and the oxide containing isolation region. An encapsulating dielectric material may then be formed in the undercut region and along the sidewalls of the opening through the blanket gate stack. The blanket gate stack may then be patterned to form a gate structure. A source region and a drain region may be formed in the active semiconductor device region on opposing sides of the gate structure.

In another aspect, a semiconductor device is provided that includes a semiconductor substrate including an active semiconductor region that is defined by an oxide containing isolation region. A gate structure is present having a length from a first end face to a second end face that extends across the active semiconductor region of the semiconductor substrate. The gate structure includes a high-k gate dielectric layer that is present on the active semiconductor region, wherein the high-k gate dielectric layer includes an overhang portion that extends over the oxide containing isolation region. A source region and a drain region is present in the active semiconductor region on opposing sides of the gate structure, wherein a channel length perpendicular to the length of the gate structure is defined by separation between the source region and the drain region. An encapsulating dielectric material is present on at least one of the first end face and the second end face of the gate structure. The encapsulating dielectric material extends into the oxide containing isolation region and is into direct contact with a lower surface of the overhang portion of the high-k gate dielectric layer.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1A:
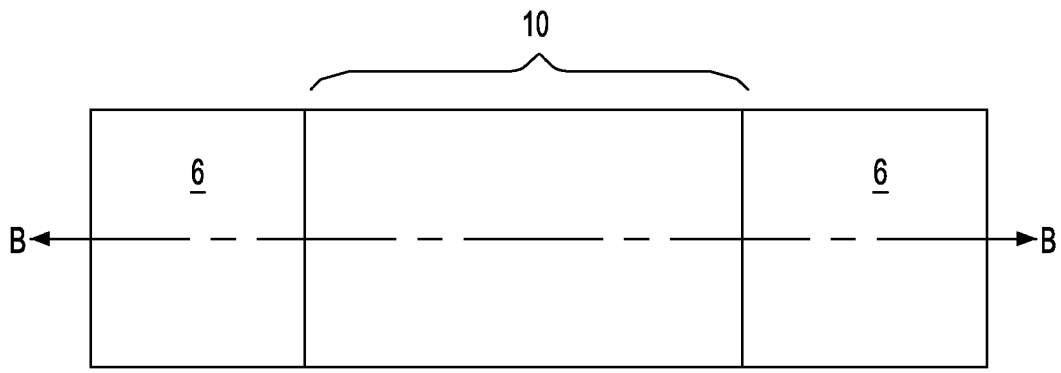
FIG. 1A is a top down planar view depicting one embodiment of forming an oxide containing isolation region in a semiconductor substrate to define an active semiconductor region, in accordance with the present disclosure.

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "vertical", "horizontal", "top", "bottom", and derivatives thereof shall relate to the invention, as it is oriented in the drawing figures.

In one embodiment, the present disclosure is related to forming semiconductor devices, such as metal oxide semiconductor field effect transistors (MOSFETs), including a high-k gate dielectric layer that has increased immunity to defects, such as oxidation of gate materials. In some instances, the oxidation of the high-k gate dielectric layer may result from contact to oxide containing isolation regions. In one embodiment, a method and structure are disclosed that separates the high-k gate dielectric layer from the oxide containing features of the semiconductor device. In some embodiments, an encapsulating dielectric material separates the high-k gate dielectric layer of the gate structure from an oxide containing isolation region at the interface between the gate structure and the oxide containing isolation region. The details of one embodiment of a method of forming a semiconductor device that protects the high-k gate dielectric layer from interactions with oxide containing materials, such as oxide containing isolation regions, are now described with reference to FIGS. 1A-8B.

Figure 1B:
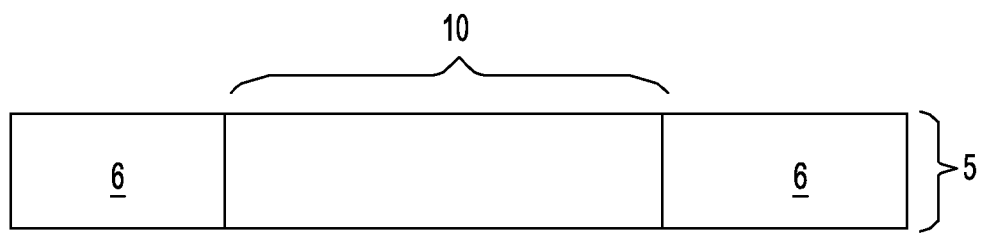
FIG. 1B is a side cross-sectional view along section line B-B in FIG. 1A.

FIGS. 1A and 1B depict one embodiment of forming an oxide containing isolation region 6 in a semiconductor substrate 5 to define an active semiconductor region 10. The semiconductor substrate 5 may be any silicon-containing substrate including, but not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. The semiconductor substrate 5 may also be composed of compound semiconductor materials, such as a type III-V semiconductor.

The oxide containing isolation region 6 may be composed of any oxide containing dielectric, such as silicon oxide, silicon oxynitride or a combination thereof. In one embodiment, the oxide containing isolation region 6 can be formed by forming a trench in the semiconductor substrate 5 utilizing a dry etching process, such as reactive-ion etching (RIE) or plasma etching, and then filling the trench with an oxide containing insulating material. In one embodiment, the trench may be filled using a deposition method, such as chemical vapor deposition (CVD). The geometry of the oxide containing isolation region 6 may be selected to define a portion of the semiconductor substrate 5 to serve as an active semiconductor region 10 that is isolated from a remaining portion of the semiconductor substrate 5.

The active semiconductor region 10 is the portion of the semiconductor substrate 5 that contains at least the source region, the drain region and the channel region of the subsequently formed semiconductor device. As used herein, the term "semiconductor device" means an intrinsic semiconductor material that has been doped, that is, into which a doping agent has been introduced, giving it different electrical properties than the intrinsic semiconductor. Although the semiconductor device that is depicted being formed in FIGS. 1A through 8B is a field effect transistor (FET), the methods and structures that are disclosed herein are not limited to only the semiconductor devices that are depicted in the supplied figures. For example, any semiconductor device having a high-k dielectric layer that is to be protected from oxidation is suitable for use with the present disclosure. In one embodiment, the active semiconductor region 10 includes a doped well region. In one embodiment, when the active semiconductor region 10 is processed to provide an n-type semiconductor device, the well region that is present in the active semiconductor region 10 may be doped to a p-type conductivity, and when the active semiconductor region 10 is processed to provide a p-type semiconductor device, the well region that is present in the active semiconductor region 10 is doped to an n-type conductivity.

Figure 2A:
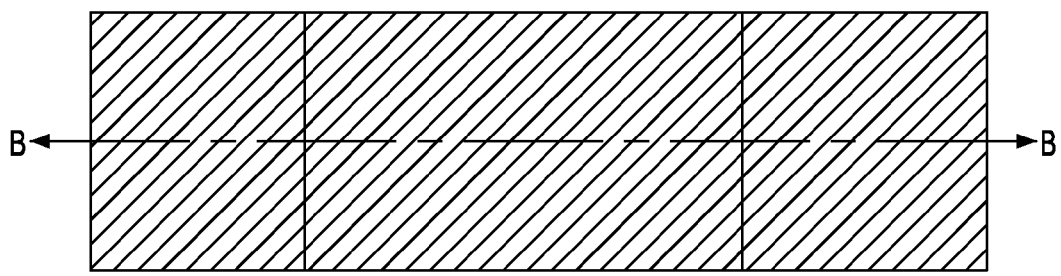
FIG. 2A is a top down planar view depicting forming a blanket gate stack including a high-k gate dielectric layer on the active semiconductor region, wherein at least a portion of the blanket gate stack extends from the active semiconductor region to the oxide containing isolation region, in accordance with one embodiment of the present disclosure.
Figure 2B:
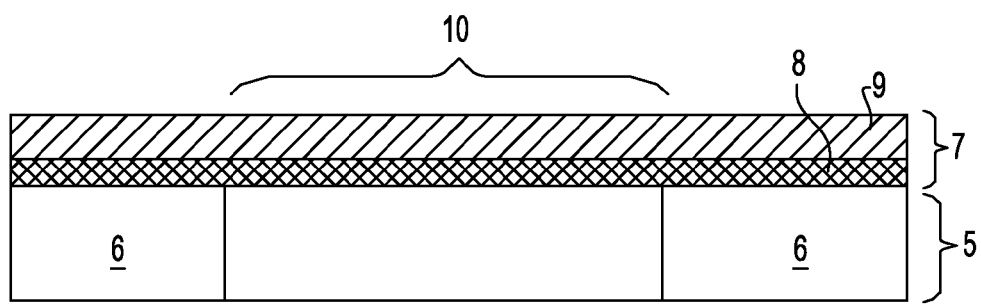
FIG. 2B is a side cross-sectional view along section line B-B in FIG. 2A.

FIGS. 2A and 2B depict one embodiment of forming a blanket gate stack 7 including a high-k gate dielectric layer 8 on the active semiconductor region 10, wherein at least a portion of the blanket gate stack 7 extends from the active semiconductor region 10 to overly the oxide containing isolation region 6. In one embodiment, the blanket gate stack 7 includes at least one high-k gate dielectric layer 8 and at least one metal gate conductor layer 9. A "high-k dielectric material" is a dielectric material having a dielectric constant at room temperature, e.g., 20° C. to 25° C., which is greater than the dielectric constant of silicon oxide ($SiO_2$). For example, a high-k dielectric material may be a material having a dielectric constant that is greater than 10, e.g., 10.1. In another embodiment, the high-k gate dielectric layer 8 is comprised of a material having a dielectric constant greater than 15.0. In yet another embodiment, the high-k gate dielectric layer 8 is comprised of a material having a dielectric constant ranging from 10 to 30. Some examples of high-k dielectric materials suitable for the high-k gate dielectric layer 8 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k gate dielectric layer 8 is hafnium oxide ($HfO_2$).

In one embodiment, the high-k gate dielectric layer 8 can be formed on the semiconductor substrate 5 using a deposition method. The terms "formed on", "present on" and "overlying" as used herein mean that an intermediate structure may be present between the structures being formed or described. For example, an interfacial oxide may be present between the high-k gate dielectric layer 8 and the semiconductor substrate 5. The term "direct contact" denotes that the structures being described are in direct contact with each other without an intermediate structures present therebetween. In one embodiment, the high-k gate dielectric layer 8 can be formed using a deposition process, such as chemical vapor deposition (CVD). Variations of chemical vapor deposition (CVD) processes for depositing the layer of the high-k gate dielectric layers include, but are not limited to, Atmospheric Pressure CVD (APCVD), Low Pressure CVD (LPCVD), Rapid Thermal CVD (RTCVD), Atomic Layer CVD (ALCVD) and Plasma Enhanced CVD (PECVD), Metal-Organic CVD (MOCVD) and others. In another embodiment, the high-k gate dielectric layer 8 may be formed by a thermal growth process such as, e.g., oxidation, nitridation or oxynitridation. The high-k gate dielectric layer 8 may be deposited over the entire surface of the semiconductor substrate 5 including the active semiconductor region 10 and the oxide containing isolation region 6. In one embodiment, the high-k gate dielectric layer 8 has a thickness as measured from the upper surface of the semiconductor substrate 5 that ranges from 0.5 nm to 10 nm. In another embodiment, the high-k gate dielectric layer 8 has a thickness as measured from the upper surface of the semiconductor substrate 5 that ranges from 1 nm to 5 nm.

Referring to FIGS. 2A and 2B, the metal gate conductor layer 9 may be deposited on an upper surface of the high-k gate dielectric layer 8. In some embodiments, the metal gate conductor layer 9 may be in direct contact with the high-k gate dielectric layer 8. The metal gate conductor layer 9 that is present on the high-k gate dielectric layer 8 may be composed of titanium (Ti), tungsten (W), tantalum (Ta), aluminum (Al), platinum (Pt), titanium nitride (TiN), tantalum nitride (TaN), tantalum silicon nitride (TaSiN), aluminum nitride (AlN), titanium aluminum nitride (TiAlN), tungsten nitride (WN), tantalum carbide (TaC), titanium carbide (TiC) or a combination thereof. The above examples of compositions for the metal gate conductor layer 9 are provided for illustrative purposes only, and are not intended to limit the present disclosure, as other compositions are equally suitable for the metal gate conductor layer 9. In some embodiments, the composition of the metal gate conductor layer 9 provides a work function shift that is suitable for an n-type or p-type semiconductor device.

The metal gate conductor layer 9 may be deposited using a physical vapor deposition (PVD) method, such as sputtering. Other methods for forming the metal gate conductor include atomic layer chemical vapor deposition (ALCVD). In one embodiment, the sputtering deposition process for forming the metal gate conductor layer 9 includes applying high-energy particles to strike a solid slab of a metal target material to provide the metal constituent of the metal gate conductor layer 9, such as tantalum (Ta), titanium (Ti), tungsten (W) or a combination thereof. The high-energy particles physically dislodge metal atoms of target material, which are then deposited on the high-k gate dielectric layer 8. In some embodiments, in which the metal gate conductor layer 9 is a metal nitride, the source of nitrogen for the metal gate conductor layer 9 may be provided by nitrogen gas ($N_2$). The nitrogen source may be introduced to the sputtering chamber as the sputtered atoms of the metal constituent of the metal gate conductor layer 9 are migrating towards the deposition surface. The metal gate conductor layer 9 may be deposited over the entire surface of the high-k gate dielectric layer 8 that is present over the entire surface of semiconductor substrate 5 including the active semiconductor region 10 and the oxide containing isolation region 6. In one embodiment, the metal gate conductor layer 9 may have a thickness ranging from 25 Å to 200 Å. In another embodiment, the metal gate conductor layer 9 has a thickness ranging from 50 Å to 100 Å.

The blanket gate stack 7 may also include a conductive semiconductor layer (not shown) that is present on an upper surface of the metal gate conductor layer 9. In one embodiment, the conductive semiconductor layer may be composed of a silicon containing material. Examples of silicon containing materials suitable for the conductive semiconductor layer include, but are not limited to, silicon, single crystal silicon, polycrystalline silicon, silicon germanium, and amorphous silicon. In one embodiment, the conductive semiconductor layer is provided by a doped semiconductor, such as n-type doped polysilicon.

In one embodiment, the conductive semiconductor layer can be deposited and then doped by ion implantation. The material for the conductive semiconductor layer may be deposited using chemical vapor deposition (CVD). Variations of CVD processes suitable for depositing the conductive semiconductor layer include, but are not limited to, Atmospheric Pressure CVD (APCVD), Low Pressure CVD (LPCVD) and Plasma Enhanced CVD (EPCVD), Metal-Organic CVD (MOCVD) and others. The conductive semiconductor layer may be doped using ion implantation following the deposition of the material for the conductive semiconductor layer. In another embodiment, the conductive semiconductor layer may be in-situ doped as the material layer for the conductive semiconductor layer is formed. In one embodiment, the conductive semiconductor layer can be composed of a silicon containing material that is doped with an n-type dopant to a concentration ranging from $5 \times 10^{18}$ cm$^{-3}$ to $5 \times 10^{20}$ cm$^{-3}$. The conductive semiconductor layer may have a thickness ranging from 2 nm to 10 nm. In another embodiment, conductive semiconductor layer may have a thickness ranging from 2 nm to 5 nm. In another embodiment, the conductive semiconductor layer can be composed of a silicon containing material that is doped with a p-type dopant.

Figure 3A:
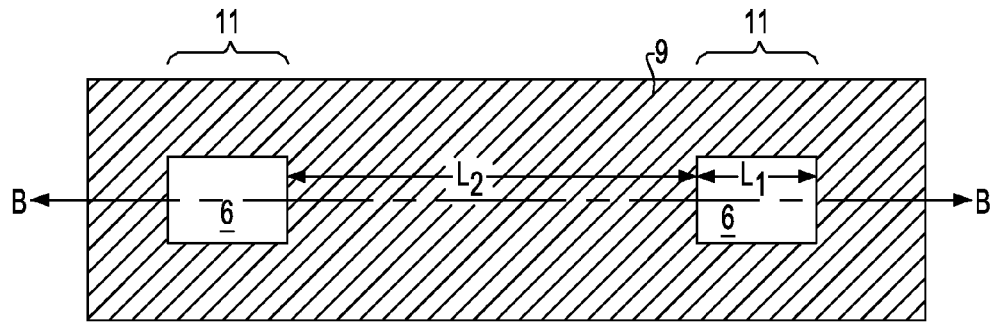
FIG. 3A is a top down planar view depicting etching the blanket gate stack to provide an opening over the oxide containing isolation region, in accordance with one embodiment of the present disclosure.
Figure 3B:
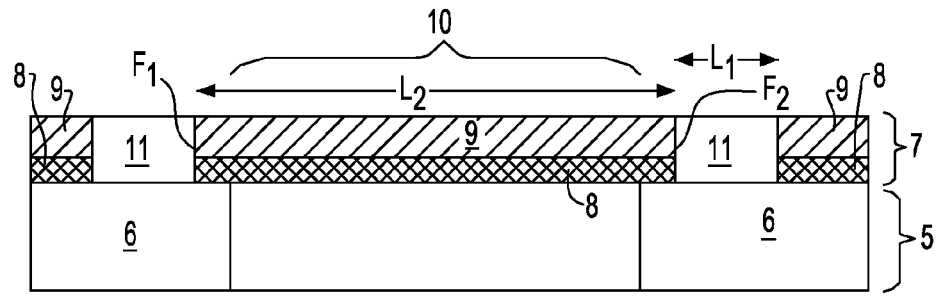
FIG. 3B is a side cross-sectional view along section line B-B in FIG. 3A.

FIGS. 3A and 3B depict etching the blanket gate stack 7 to provide an opening 11 over the oxide containing isolation region 6. In one embodiment, the blanket gate stack 7 can be etched at opposing sides of the active semiconductor region 10 at an interface between the oxide containing isolation region 6 and the active semiconductor region 10. The opening 11 may be formed using deposition, photolithography and etch processes. For example, an etch mask may produced on the upper surface of the blanket gate stack 7 by applying a photoresist to the surface to be etched, i.e., the portion of the blanket gate stack 7 that is over the oxide containing isolation region 6; exposing the photoresist to a pattern of radiation; and then developing the pattern into the photoresist utilizing resist developer to provide the etch mask. The remaining portion of the photoresist following development provides the etch mask. Once the patterning and development of the photoresist is completed, the sections of the blanket gate stack 7 that are covered by the etch mask, i.e., remaining portions of the photoresist, are protected while the exposed regions of the blanket gate stack 7, i.e., the portion of the blanket gate stack 7 that is over the oxide containing isolation region 6, are removed using a selective etching process. As used herein, the term "selective" in reference to a material removal process denotes that the rate of material removal for a first material is greater than the rate of removal for at least another material of the structure to which the material removal process is being applied. For example, a first material may be removed selectively to a second material by an etch rate ratio of 10:1. In another example, the first material may be removed selectively to the second material by an etch rate ratio of 100:1. In one embodiment, the exposed portions of the blanket gate stack 7 may be etched selectively to the etch mask and the oxide containing isolation region 6.

The etch process that forms the openings 11 in the blanket gate stack 7 may be an anisotropic etch, such as reactive ion etch. The term "anisotropic" denotes a material removal process in which the material removal rate in the direction normal to the surface of the material to which the etching species is being applied is greater than in the direction parallel to the surface of the material to be removed. Reactive ion etching (RIE) is a form of plasma etching in which during etching the surface to be etched is exposed to reactive gases in the presence of an RF field. During RIE the surface to be etched takes on a potential that accelerates the reactive species extracted from a plasma toward the surface, in which the chemical etching reaction is taking place in the direction normal to the surface. Other anisotropic etch processes that are suitable for forming the openings 11 in the blanket gate stack 7 include ion beam etching, plasma etching or laser ablation.

Referring to FIGS. 3A and 3B and in one embodiment, the openings 11 in the blanket gate stack 7 may have a length L1 ranging from 10 nm to 1,000 nm. In another embodiment, the openings 11 in the blanket gate stack 7 may have a length L1 ranging from 20 nm to 100 nm. In yet another embodiment, the openings 11 in the blanket gate stack 7 may have a length L1 ranging from 40 nm to 80 nm.

Forming the openings 11 in the blanket gate stack 7 defines the length L2 of the gate structure. The length L2 of the gate structure is a dimension that is on the same plane, and is perpendicular to, the dimension that defines the length of the channel region. The length of the channel region is defined as the distance separating the subsequently formed source region from the drain region. Forming the openings 11 in the blanket gate stack also forms, i.e., exposes, the first end face F1 and the second end face F2 of the gate structure. In one embodiment, the length L2 of the gate structure ranges from 35 nm to 10,000 nm. In another embodiment, the length L2 of the gate structure ranges from 80 nm to 1,000 nm.

Figure 4A:
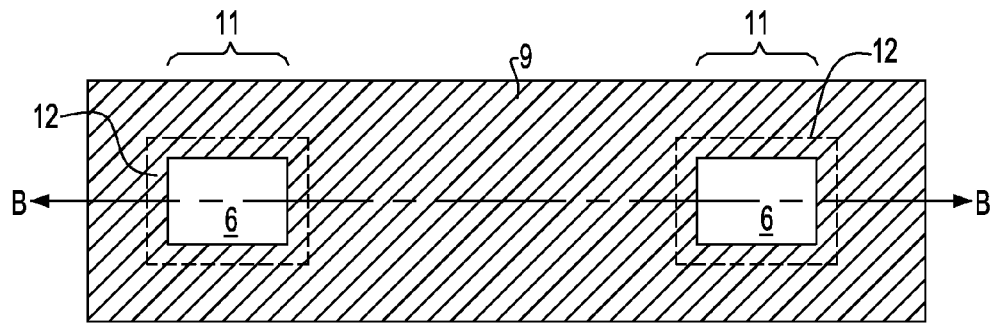
FIG. 4A is a top down planar view depicting isotropically etching the surface of the oxide containing isolation region that is exposed by the opening to remove a portion of the oxide containing isolation region that is in contact with the high-k gate dielectric layer and form an undercut region at an interface between the blanket gate stack and the oxide containing isolation region, in accordance with one embodiment of the present disclosure.
Figure 4B:
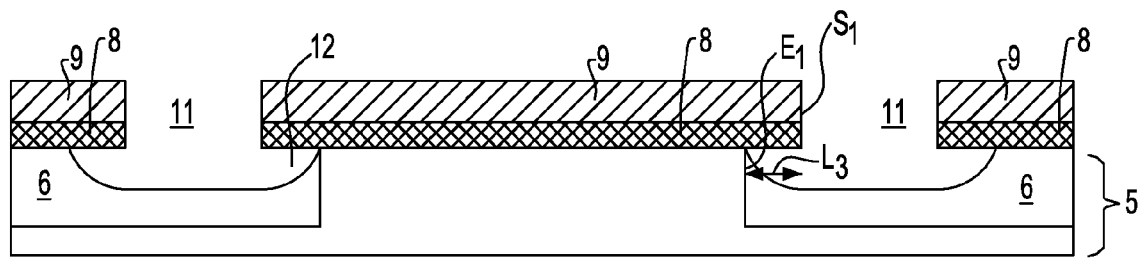
FIG. 4B is a side cross-sectional view along section line B-B in FIG. 4A.

FIGS. 4A and 4B depict isotropically etching the surface of the oxide containing isolation region 6 that is exposed by the opening 11 to remove a portion of the oxide containing isolation region 6 that is in contact with the high-k gate dielectric layer 8 and form an undercut region 12 at an interface between the blanket gate stack 7 and the oxide containing isolation region 6. The term "undercut region" denotes a void in a material that extends underneath an overlying structure. In one embodiment, following isotropic etching of the exposed surface of the oxide containing isolation region 6, the undercut region 12 may have a length L3 that extends from the sidewall S1 of the opening 11 through the blanket gate stack 7 in a direction towards the center of the length L2 of the gate structure that may range from 15 nm to 500 nm. In another embodiment, the undercut region 12 may have a length L3 that extends from the sidewall S1 of the opening 11 that ranges from 15 nm to 120 nm. In yet another embodiment, the undercut region 12 may have a length L3 that extends from the sidewall S1 of the opening 11 that ranges from 15 nm to 60 nm. The length L3 of the undercut region 12 is measured to the edge E1 of the undercut region 12 having the farthest distance from the sidewall S1 of the opening 11. The length L3 of the undercut region 12 exposes a lower surface of the high-k gate dielectric layer 8. Therefore, in some embodiments, the length of the exposed portion of the high-k gate dielectric layer 8 is equal to the length L3 of the undercut region 12. In some embodiments, the edge E1 of the undercut region E1 may be in direct contact with the active semiconductor region 10. The sidewall of the undercut region 12, as well as the base of the undercut region 12, may have a curvature, as depicted in FIG. 4B.

Referring to FIGS. 4A and 4B, the etch process for forming the undercut region 12 may be an isotropic etch that is selective to at least the high-k gate dielectric layer 8 of the blanket gate stack 7. In one embodiment, the isotropic etch removes the material of the oxide containing isolation region 6 selectively to the metal gate conductor layer 9 and the high-k gate dielectric layer 8 of the blanket gate stack 7. Contrary to anisotropic etching, isotropic etching is non-directional. In one embodiment, by 'non-directional' it is meant that the isotropic etch removes the material being etched at substantially the same rate in all directions. In one embodiment, the isotropic etch process that forms the undercut region 12 can be a wet etch. Some examples of wet etch chemistries that remove the material of the oxide containing isolation region 6, e.g., silicon oxide isolation region, selectively to the blanket gate stack 7 include a hydrofluoric (HF) acid etch. In one example, hydrofluoric (HF) acid may be employed for selective removal of the oxide containing isolation region 6, in which the hydrofluoric (HF) acid solution may be buffered with ammonium fluoride ($NH_4F$). The wet etch chemistry may be applied using spraying or immersing the surface to be etched in the wet etch chemistry. The isotropic etch process may be timed to provide the proper degree of etching that is suitable for the forming undercut region 12.

In another embodiment, chemical oxide etch removal (COR) can be used to etch the exposed surface of the oxide containing isolation region 6 to provide the undercut region 12. The COR processing step comprises exposing the structure to a gaseous mixture of HF and ammonia at a pressure of 30 mTorr or below, at a pressure between 1 mTorr and 10 mTorr, and a temperature of 25° C. or a temperature slightly above room temperature. The ratio of gaseous HF to gaseous ammonia is from 1:10 to 10:1, with a ratio of 2:1 being more highly preferred. In addition to COR etching, the exposed surface of the oxide containing isolation region 6 may also be etched with a SiCoNi oxide etch.

Figure 5A:
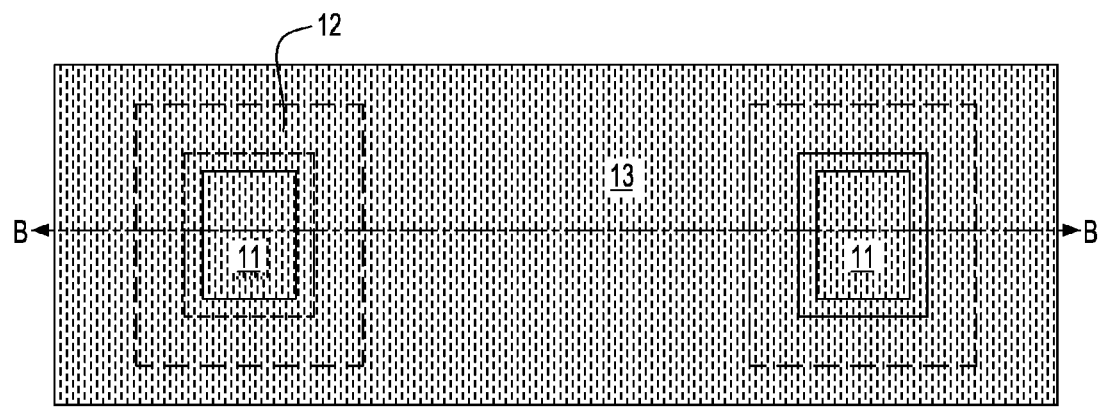
FIG. 5A is a top down planar view depicting forming an encapsulating dielectric material in the undercut region in contact with the high-k gate dielectric layer and along sidewalls of the opening through the blanket gate stack, in accordance with one embodiment of the present disclosure.
Figure 5B:
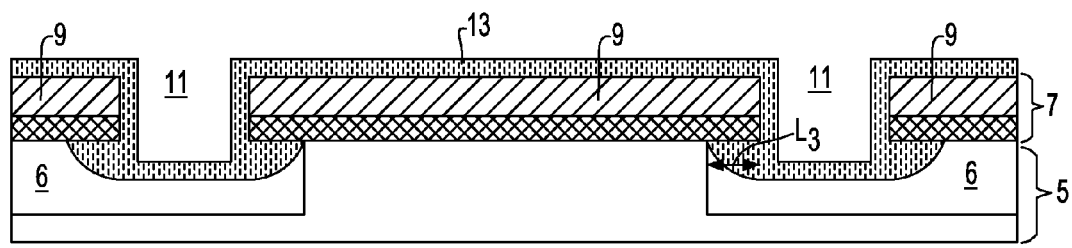
FIG. 5B is a side cross-sectional view along section line B-B in FIG. 5A.

FIGS. 5A and 5B depict forming an encapsulating dielectric material 13 in the undercut region 12 in contact with the overhang portion of the high-k gate dielectric layer 8 and along the sidewalls of the opening 11 through the blanket gate stack 7. In one embodiment, the encapsulating dielectric material 13 is also present on the upper surface of the blanket gate stack 7. The term "encapsulating" as used to describe the encapsulating dielectric material 12 means that the material is in direct contact with at least the overhang portion of the high-k gate dielectric layer 8 and separates the overhang portion of the high-k gate dielectric layer 8 from the oxide material that is present in the oxide containing isolation region 6. In one embodiment, the encapsulating dielectric material 13 is a nitride containing dielectric, such as silicon nitride. The encapsulating dielectric material 13 is not limited to only nitride materials. Instead, other materials that are not oxides are suitable for the encapsulating dielectric material 13. For example, hydrogenated amorphous silicon carbide (α-SiC:H) can be used as the encapsulating dielectric material 13. Other dielectric materials may also be employed for the encapsulating dielectric material 13, so long as the dielectric material is not conductive, can serve as a diffusion barrier, and may be formed using a deposition process that does not introduce oxygen.

The encapsulating dielectric material 13 may be formed by a deposition method, such as chemical vapor deposition (CVD). Examples of chemical vapor deposition (CVD) methods that are suitable for forming the encapsulating dielectric material 13 include metal organic chemical vapor deposition (MOCVD), atomic layer chemical vapor deposition (ALCVD), pulsed chemical vapor deposition, plasma enhanced chemical vapor deposition (PECVD), high density plasma chemical vapor deposition (HDPCVD). Other deposition methods for forming the encapsulating dielectric material 13 include spinning from solution, spraying from solution, plasma nitridation, ion-beam deposition, and evaporation.

In some embodiments, a portion of the encapsulating dielectric material 13 fills the undercut region 12. The portion of the encapsulating dielectric material 13 that is present on the sidewalls of the openings 11 through the blanket gate stack 7 and the portion of the encapsulating dielectric material 13 that is present on the upper surface of the blanket gate stack 7 may be substantially conformal, and may have a thickness in the range from 30 angstroms to 1500 angstroms. In another embodiment, the portion of the encapsulating dielectric material 13 that is present on the sidewalls of the openings 11 through the blanket gate stack 7 and the portion of the encapsulating dielectric material 13 that is present on the upper surface of the blanket gate stack 7 may have a thickness ranging from 30 angstroms to 100 angstroms.

Figure 6A:
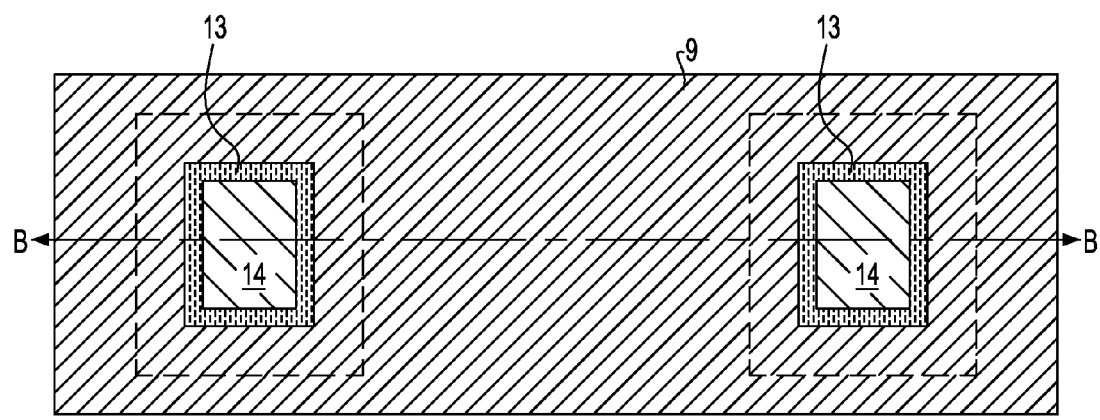
FIG. 6A is a top down planar view depicting filling the openings with a plug dielectric, in accordance with one embodiment of the present disclosure.
Figure 6B:
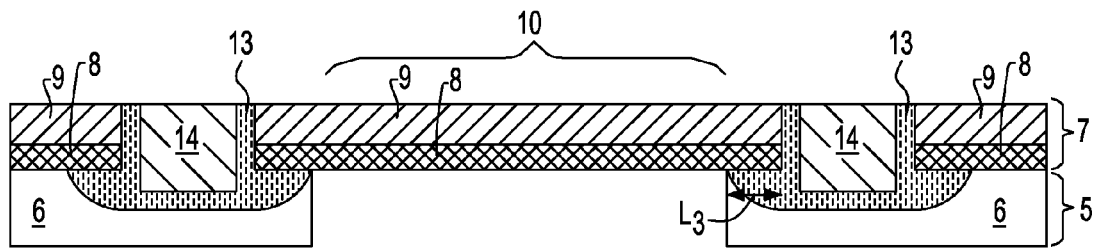
FIG. 6B is a side cross-sectional view along section line B-B in FIG. 6A.

FIGS. 6A and 6B depict filling the openings 11 with a plug dielectric 14. The plug dielectric 14 may be any dielectric material including oxides, nitrides or oxynitrides. For example, the plug dielectric 14 may be composed of silicon oxide. Other dielectrics that are suitable for the plug dielectric 14 include $SiO_2$, $Si_3N_4$, $SiO_xN_y$, SiC, SiCO, SiCOH, SiCH, and combinations thereof. The material for the plug dielectric 14 may be deposited using chemical vapor deposition (CVD), such as metal organic chemical vapor deposition (MOCVD), plasma enhanced chemical vapor deposition (PECVD), high density plasma chemical vapor deposition (HDPCVD) and others. In addition to chemical vapor deposition (CVD), the plug dielectric 14 may also be formed using spinning from solution, spraying from solution, and evaporation. Typically, the material for the plug dielectric 14 fills the openings 11 and is also deposited on the encapsulating dielectric material 13 that is present on the upper surface of the blanket gate stack 7.

Following deposition of the material for the plug dielectric 14, a planarization process removes the portion of the plug dielectric material that extends from the openings 11 to overly the portion of the encapsulating dielectric material 13 that is present on the upper surface of the blanket gate stack 7. "Planarization" is a material removal process that employs at least mechanical forces, such as frictional media, to produce a planar surface. In one embodiment, the planarization process includes chemical mechanical polishing (CMP) or grinding. Chemical mechanical planarization (CMP) is a material removal process using both chemical reactions and mechanical forces to remove material and planarize a surface. In one embodiment, the planarization process removes the portion of the plug dielectric material that extends from the openings 11 onto the portion of the encapsulating dielectric material 13 that is present on the upper surface of the blanket gate stack 7, as well as removing the portion of the encapsulating dielectric material 13 that is present on the upper surface of the blanket gate stack 7, as depicted in FIG. 6B. In this embodiment, following planarization, an upper surface of the blanket gate stack 7 is coplanar with an upper surface of the planarized encapsulating dielectric material 13 and an upper surface of the planarized plug dielectric 14.

Figure 7A:
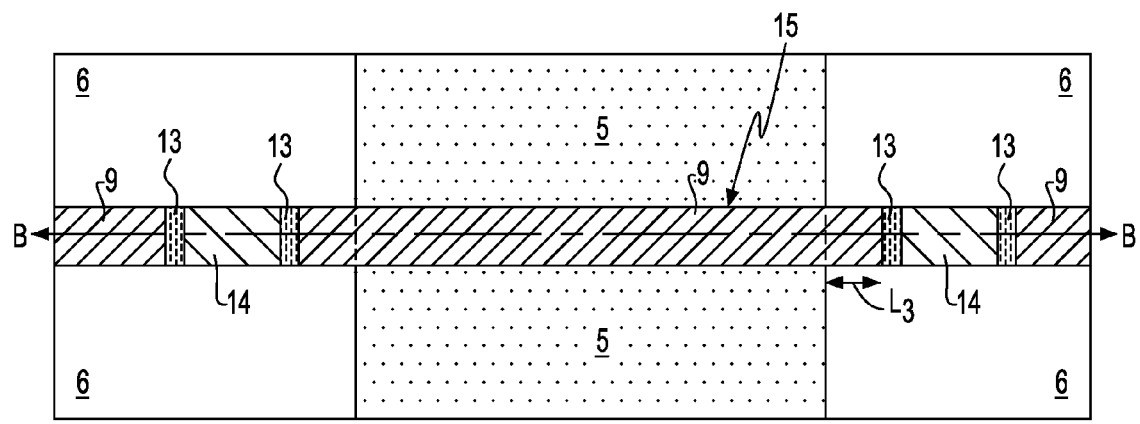
FIG. 7A is a top down planar view of one embodiment of patterning the blanket gate stack to form a gate structure, in accordance with the present disclosure.
Figure 7B:
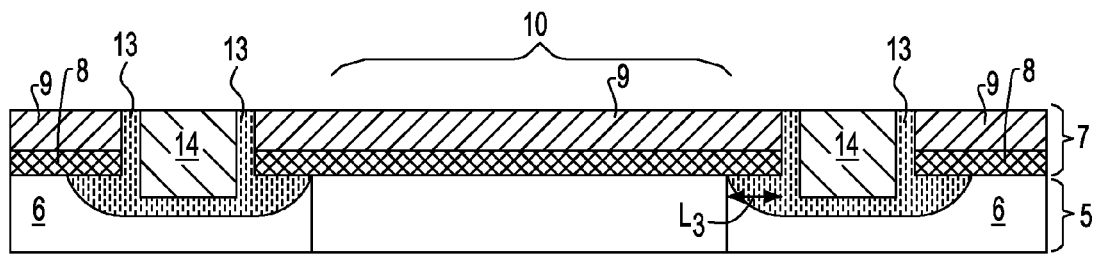
FIG. 7B is a side cross-sectional view along section line B-B in FIG. 7A.

FIGS. 7A and 7B depict one embodiment of etching the blanket gate stack 7 to provide a gate structure 15 spanning across the active semiconductor region 10 to over the oxide containing isolation regions 6. A "gate structure" is a structure used to control output current (i.e., flow of carriers in the channel, e.g., turn "on" or "off") of a semiconductor device through electrical fields. In one embodiment, forming the gate structure 15 from the blanket gate stack 7 includes photolithography and a selective etching process. Specifically, an etch mask composed of photoresist is produced by applying a photoresist layer to the surface to be etched, exposing the photoresist layer to a pattern of radiation, and then developing the pattern into the photoresist utilizing a resist developer. Once the patterning of the photoresist is completed to form the etch mask, the sections covered by the etch mask are protected while the exposed regions are removed using a selective etching process that removes the unprotected regions. Following formation of the etch mask on the blanket gate stack 7, the exposed portions of the blanket gate stack 7 are etched to form the gate structure 15 and expose portions of the active semiconductor region 10 in which the source regions and drain regions are to be formed. Examples of anisotropic etch process suitable for forming the gate structures 15 include, but are not limited to, reactive-ion etching (RIE), ion beam etching, plasma etching and/or laser ablation. In addition to photoresist masks that are used to form the gate structure 15, hard masks composed of dielectrics, such as silicon oxide, silicon nitride, silicon oxynitride and a combination thereof, may be employed in the process sequence for forming the gate structure 15.

Figure 8A:
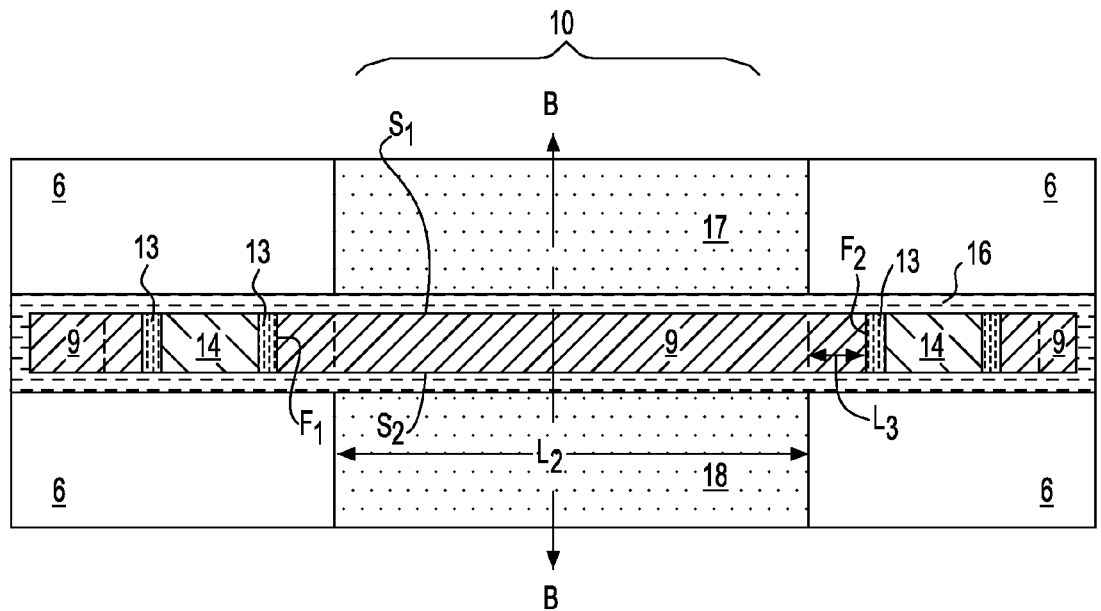
FIG. 8A is a top down planar view of one embodiment of forming a spacer on sidewalls of the gate structure and forming a source region and a drain region in the active semiconductor region on opposing sides of the gate structure, in accordance with the present disclosure.
Figure 8B:
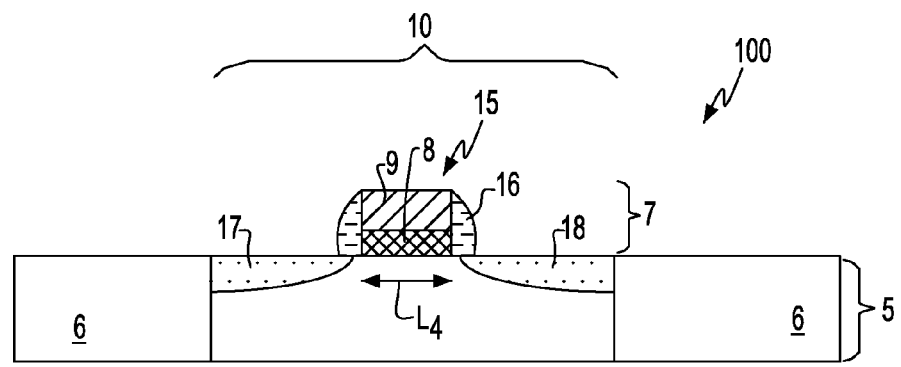
FIG. 8B is a side cross-sectional view along section line B-B in FIG. 8A.

FIGS. 8A and 8B depict one embodiment of forming a spacer 16 on sidewalls S2 of the gate structure 15 and forming a source region 17 and a drain region 18 in the active semiconductor region 10 of the semiconductor substrate 5. The source region 17 and the drain region 18 are formed on opposing sides of the gate structure 15. Each sidewall S2 of the gate structure extends from the first end face F1 to the second end face F2 of the gate structure 15. Typically, the spacer 16 is a nitride, such as silicon nitride ($Si_3N_4$). In one embodiment, the spacer 16 may be composed the same material as the encapsulating dielectric material 13. In one embodiment, the spacer 16 can be formed by deposition processes, such as chemical vapor deposition (CVD) in combination with an anisotropic etch, such as reactive ion etch. In one embodiment, the spacer 16 encapsulates the sidewalls S2 of the gate structure 15, and the encapsulating dielectric material 13 encapsulates the first end face F1 and the second end face F2 of the gate structure 15.

FIGS. 8A and 8B also depicts one embodiment of forming the source region 17 and the drain region 18 of the semiconductor device that is present within the active semiconductor region 10. As used herein, the term "source" is a doped region in the semiconductor device, in which majority carriers are flowing into the channel region that is underlying the functional gate structure. As used herein, the term "drain" means a doped region in semiconductor device located at the end of the channel, in which carriers are flowing out of the semiconductor through the drain. In one embodiment, the source region 17 and the drain region 18 that are present in the active semiconductor region 10 may be doped to an n-type conductivity, and the source region 17 and the drain region 18 that are present in the active semiconductor region 10 may be doped to a p-type conductivity. As used herein, "p-type" refers to the addition of impurities to an intrinsic semiconductor that creates deficiencies of valence electrons. In a silicon containing semiconductor substrate 5, examples of p-type dopants, i.e., impurities, include but are not limited to boron, aluminum, gallium and indium. As used herein, "n-type" refers to the addition of impurities that contributes free electrons to an intrinsic semiconductor. In a silicon containing semiconductor substrate 5 examples of n-type dopants, i.e., impurities, include but are not limited to, antimony, arsenic and phosphorous. The dopant for the source region 17 and the drain region 18 may be introduced via ion implantation. Although not depicted in the supplied figures, raised source and drain regions may also be employed with the teachings of the present disclosure. Further, the source and drain regions may includes implanted dopants to increase the solubility of the n-type or p-type dopants, such as germanium (Ge) and xenon (Xe), and the source and drain regions may include implanted dopants to limit transient diffusion of the n-type or p-type dopants, such as carbon (C) and fluorine (F).

Referring to FIGS. 8A and 8B and in one embodiment, the above described method provides a semiconductor device 100 that includes a semiconductor substrate 5 having an active semiconductor region 10 that is defined by an oxide containing isolation region 6. The semiconductor device 100 includes a gate structure 15 having a length L2 from a first end face F1 to a second end face F1 of the gate structure 15, in which the length L2 of the gate structure 15 extends across the active semiconductor region 10 of the semiconductor substrate 5 from one oxide containing isolation region 6 to an opposing oxide containing isolation region 6. The gate structure 15 includes a high-k gate dielectric layer 8 that is present on the active semiconductor region 10 and a metal gate conductor layer 9 that is present on the high-k gate dielectric layer 8. The high-k gate dielectric layer 8 includes an overhang portion having a length L3 that extends over the oxide containing isolation region 6. A source region 17 and a drain region 18 are present in the active semiconductor region 10 on opposing sides of the gate structure 15. The distance separating the source region 17 from the drain region 18 is the channel length L4, which is perpendicular to the length L2 of the gate structure 15. An encapsulating dielectric material 13 is present on at least one of the first end face F1 and the second end face F1 of the gate structure 15. The encapsulating dielectric material 13 extends into the oxide containing isolation region 6 into direct contact with a lower surface of the overhang portion of the high-k gate dielectric layer 8, as depicted in FIG. 7B.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A semiconductor device comprising:
    a semiconductor substrate including an active semiconductor region that is defined by an oxide containing isolation region;
    a gate structure having a length from a first end face to a second end face extending across the active semiconductor region of the semiconductor substrate, wherein the gate structure includes a high-k gate dielectric layer that is present on the active semiconductor region, the high-k gate dielectric layer includes an overhang portion that extends over the oxide containing isolation region;
    a source region and a drain region in the active semiconductor region on opposing sides of the gate structure, wherein a channel length perpendicular to the length of the gate structure is defined between the source region and the drain region; and
    an encapsulating dielectric material present on at least one of the first end face and the second end face of the gate structure, wherein the encapsulating dielectric material extends beneath an uppermost surface of the semiconductor substrate, into the oxide containing isolation region, and is in direct contact with a bottommost surface of the overhang portion of the high-k gate dielectric layer.

2. The semiconductor device of claim 1, wherein the oxide containing isolation region is comprised of silicon dioxide or silicon oxynitride.

3. The semiconductor device of claim 2, wherein the gate structure includes an interfacial oxide layer, the high-k gate dielectric layer, a metal containing layer and a semiconductor layer.

4. The semiconductor device of claim 3, wherein the interfacial oxide is comprised of silicon dioxide or silicon oxynitride, the high-k gate dielectric layer is comprised of a hafnium containing dielectric, the metal containing layer comprises tantalum nitride, titanium nitride, tungsten nitride, titanium aluminum nitride, aluminum nitride or a combination thereof, and the semiconductor layer comprises silicon, polysilicon or a combination thereof.

5. The semiconductor device of claim 2, wherein the overhang portion of the high-k gate dielectric layer that extends over the oxide containing isolation region has a length that ranges from 15 nm to 500 nm.

6. The semiconductor device of claim 2, wherein the encapsulating dielectric material comprises a dielectric selected from the group consisting of silicon nitride, amorphous silicon carbide ($\alpha$-SiC) and a combination thereof.

7. The semiconductor device of claim 2 further comprising spacers present on sidewalls of the gate structure extending from the first end face to the second end face of the gate structure.

8. The semiconductor device of claim 7, wherein the spacers are comprised of a nitride containing dielectric.

9. The semiconductor device of claim 7 further comprising a plug dielectric filling the oxide containing isolation region, wherein the plug dielectric is present on the encapsulating dielectric material that is present in the oxide containing isolation region.

10. A semiconductor device comprising:
    a semiconductor substrate including an active semiconductor region that is defined by an oxide containing isolation region;
    a gate structure having a length from a first end face to a second end face extending across the active semiconductor region of the semiconductor substrate, wherein the gate structure includes, from bottom to top, an interfacial oxide layer, a metal containing layer, a semiconductor layer and a high-k gate dielectric layer that is present on the active semiconductor region, the high-k gate dielectric layer includes an overhang portion that extends over the oxide containing isolation region;
    a source region and a drain region in the active semiconductor region on opposing sides of the gate structure, wherein a channel length perpendicular to the length of the gate structure is defined between the source region and the drain region; and
    an encapsulating dielectric material present on at least one of the first end face and the second end face of the gate structure, wherein the encapsulating dielectric material extends into the oxide containing isolation region and is in direct contact with a lower surface of the overhang portion of the high-k gate dielectric layer.

* * * * *